United States Patent [19]

Aichelmann, Jr.

[11] 4,165,539
[45] Aug. 21, 1979

[54] BIDIRECTIONAL SERIAL-PARALLEL-SERIAL CHARGE-COUPLED DEVICE

[75] Inventor: Frederick J. Aichelmann, Jr., Hopewell Junction, N.Y.

[73] Assignee: International Business Machines Corporation, Armonk, N.Y.

[21] Appl. No.: 920,922

[22] Filed: Jun. 30, 1978

[51] Int. Cl.² .................. G11C 11/34; G11C 19/28
[52] U.S. Cl. ........................... 365/183; 357/24; 365/77; 365/219
[58] Field of Search ............... 365/77, 78, 183, 219; 357/24; 307/221 C

[56] References Cited

U.S. PATENT DOCUMENTS 3,913,077  10/1975  Erb .................................... 365/183

Primary Examiner—Stuart N. Hecker
Attorney, Agent, or Firm—Martin G. Reiffin

[57] ABSTRACT

A bidirectional serial-parallel-serial charge-coupled device wherein each serial section is both an input register and an output register, and serial streams of charge packets flow simultaneously in opposite directions in the parallel section. Odd data bits of a serial input stream flow into a first serial register and then through the parallel section in one direction and then out of the second serial register, while concurrently the even data bits flow into the second serial register and then through the parallel section in the opposite direction and then out of the first serial register. The data transfer rate is thereby substantially doubled.

10 Claims, 15 Drawing Figures

BIDIRECTIONAL SERIAL-PARALLEL-SERIAL CHARGE-COUPLED DEVICE

BACKGROUND OF THE INVENTION

1. Field of the Invention

This invention relates generally to serial-parallel-serial charge-coupled devices, and more particularly to a bidirectional device wherein serial streams of charge packets flow simultaneously in opposite directions through the parallel section.

2. Description of the Prior Art

Charge-coupled device (CCD) structures for use in data processing system storage and communication signal processing are well-known in the art. Referring to the patents and publications listed below under the heading "References Cited By Applicant", Boyle and Smith [Refs. 1, 2, 3] originally disclosed the basic charge-coupled concept. Weimer [Ref. 4] disclosed the serial-parallel-serial arrangement. Tompsett [Ref. 5] reviewed further early work, including the serial-parallel-serial configuration. Collins et al. [Ref. 6] disclosed a serial-parallel-serial structure with doublelevel metallization. Carnes, Kosonocky and Sauer [Refs. 7, 8] disclosed further advances including two-phase operation, buried channel structures, and applications to analog signal processing and image sensors.

In a serial-parallel-serial configuration, a data bit stream is injected into a serial CCD shift register from where it is transferred in parallel to a parallel storage section. The data can then be shifted in parallel through the parallel section, and then transferred in parallel to an output serial register, from where it is shifted out as a serial bit stream.

This serial-parallel-serial configuration had bit density limitations because charge-coupled devices require both transfer and storage sites. That is, in a two-phase serial shift register, the storage of one bit of information requires not only a storage site but also a transfer site so that bits are actually stored at one instant of time in only one-half of the available sites. For example, in a two-phase serial CCD with eight sites, only four bits can be stored. The parallel section was similarly limited in that the channel width was necessarily twice the width of a single site in the serial sections so that only one-half of the potentially available storage sites in the parallel section could be utilized.

Bit storage density was then significantly improved by the interlaced modification of the serial-parallel-serial configuration. In an interlaced version of the above example having eight sites and two-phase operation, all eight serial bits can be transferred in parallel through the parallel section, at least theoretically doubling the number of bits that can be stored in the parallel section. Embodiments of interlaced configuations are disclosed by Elmer et al. [Ref. 9, 10, 11], Kosonocky [Ref. 8], and Erb [Ref. 12].

Although the charge-coupled device structure is substantially simpler and therefore less expensive to manufacture than random access memory structures, the charge-coupled device operates in a serial access mode and is therefore substantially slower in operation. This is the major disadvantage of charge-coupled devices as compared with random access memory circuits.

The serial access aspect of charge-coupled devices is further aggravated by the alternate-cycle mode of operation of prior charge-coupled devices. That is, the requirement for alternating transfer and storage sites heretofore made it necessary to input and output the successive data bits at alternate clock cycles. For example, if the clock frequency were two megahertz then the data transfer rate would be only one megahertz.

This performance limitation of the prior art could not be obviated by simply increasing the clock frequency. The power dissipation of the device is approximately proportional to the clock frequency, in accordance with the formula:

$$\text{Power} = K \times \text{Capacitance} \times \text{Voltage}^2 \times \text{Frequency}$$

Therefore, for a given power dissipation the clock frequency is substantially predetermined, and any attempt to substantially increase the data transfer rate by increasing the clock frequency results in a proportionate increase in the power dissipation.

SUMMARY OF THE INVENTION

It is therefore a primary object of the present invention to provide a novel serial-parallel-serial charge-coupled device structure which obviates the data transfer rate limitation arising from the alternate-cycle data transfer mode of operation of the prior art devices.

That is, the device in accordance with the present invention operates in a novel manner so as to input and output the successive data bits at every clock cycle rather than at alternate clock cycles as heretofore necessary in the prior art. As a result, the performance of the present invention, as measured by the data transfer rate, is almost double that of equivalent prior art devices.

This performance increase is achieved in the present invention by providing that each of the serial sections function as both an input register and an output register. The input serial data bit stream is divided into two data bit streams with the alternate odd bits flowing to a first serial register and the alternate even bits flowing to the second serial register.

The parallel section is also novel in that it is bidirectional. The odd data bits flow in one direction through the parallel section while simultaneously the even data bits flow in the opposite direction through the same parallel section.

Thus the odd bits enter the first serial register but end up in the second serial register, while the even bits enter the second serial register but end up in the first serial register. The odd bits may then be output from the second serial register, or alternatively may be regenerated and transmitted back to the first serial register to repeat this cycle of operation. Similarly, the even bits may be output from the first serial register, or alternatively may be regenerated and transmitted back to the second serial register to repeat the cycle of operation.

At each and every clock cycle, with the exception of the skip interval described below upon transfer between serial and parallel sections, a data bit is either output from the serial-parallel-serial configuration or regenerated and transferred to the other serial register. The odd data bits will thus be output or regenerated at the Phase 1 clock cycles, for example, and the even data bits will be output or regenerated at the alternate Phase 2 clock cycles. Therefore, except for the skip intervals, two bits will be transferred for every pair of clock cycles, thereby approximately doubling the performance as compared with equivalent prior art devices.

IN THE DRAWINGS

FIGS. 3 to 14 inclusive show the step-by-step sequence of the flow of data bits through the serial and parallel sections.

Figure 15:
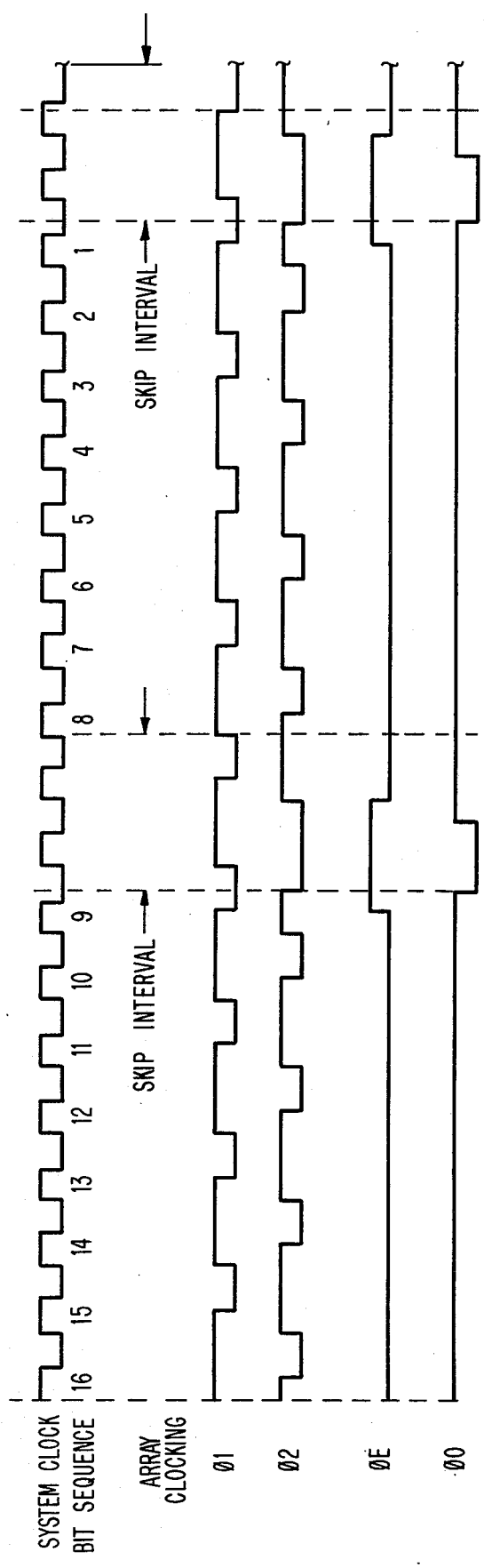

FIG. 15 depicts the clocking associated with FIGS. 3 through 14 and shows the skip interval.

DETAILED DESCRIPTION

Figure 1:
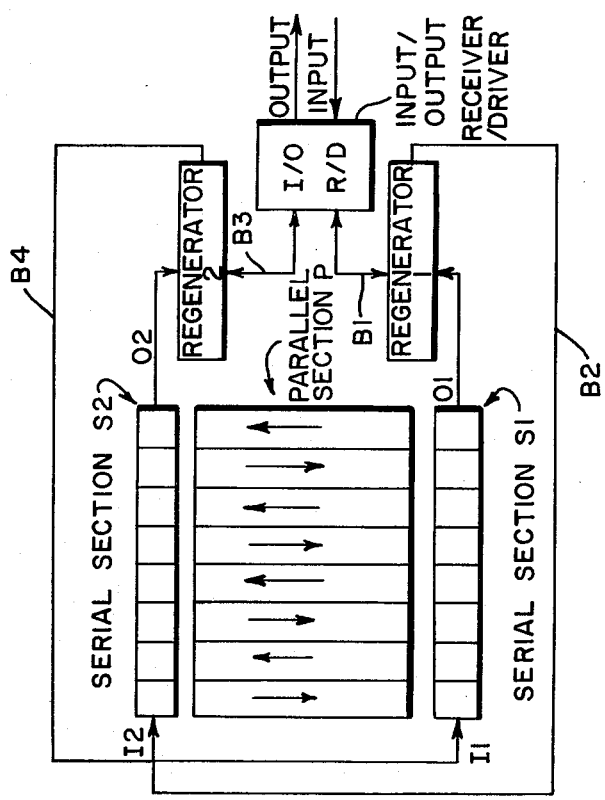
FIG. 1 is a schematic view of a bidirectional serial-parallel-serial configuration in accordance with the present invention.

Referring first to FIG. 1 wherein is shown a preferred embodiment, a parallel section P extends between a first serial section S1 and a second serial section S2. Unlike the serial sections of serial-parallel-serial configurations of the prior art, in the disclosed embodiment each of the serial sections S1, S2 functions as both an input section and an output section. The parallel section P also differs from parallel sections of the prior art in that it is bidirectional, as shown by the arrows in FIG. 1. That is, parallel section P comprises a matrix of charge packet storage sites forming vertical columns or paths extending between the serial sections S1, S2. In alternate columns the direction of charge packet transfer is shown as downward from serial section S2 to serial section S1, and is shown as upward from serial section S1 to serial section S2 in the other columns.

Serial section S1 is provided at its right-hand end, as viewed in FIG. 1, with an output 01 from which the data bits are transmitted serially to a conventional regenerator 1. The data bits may then be transmitted along a bidirectional bus B1 to a conventional input-/output receiver/driver device I/O R/D from which the data bits may be transmitted from the OUTPUT port. Alternately, the data bits may be transmitted from regenerator 1 by bus B2 to the input I2 at the left-hand end of the second serial section S2. After being serially shifted into the latter, the data bits in the form of discrete charge packets may then be transmitted in parallel downwardly through the alternate parallel section columns having downwardly directed arrows applied thereto in the drawing. This row of data bits may then be transferred to the first serial section S1 and the cycle may be repeated.

In a similar manner, data bits in the form of discrete charge packets present in the second serial section S2 may be transmitted to regenerator 2 and then transmitted to input/output receiver/driver device I/O R/D by a bidirectional bus B3. Alternately, the data bits transmitted from the second serial section S2 to regenerator 2 may be transmitted by bus B4 to the input I1 at the left-hand end of the first serial section S1. The data bits may then be transferred in parallel from serial section S1 into the lower row of parallel section P and then transferred upwardly along the alternate upwardly-directed columns or channels of parallel section P so as to eventually arrive in their original charge storage sites within the second serial section S2.

Figure 2:
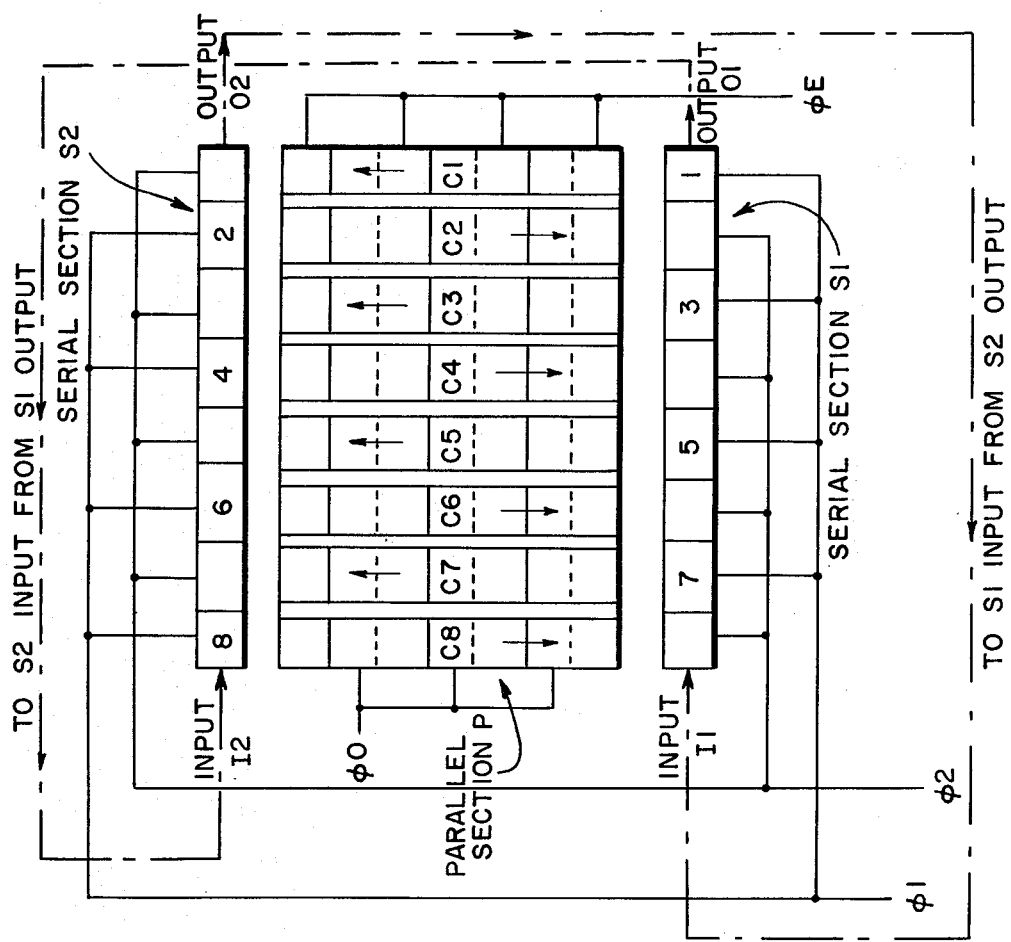
FIG. 2 is a schematic view of the serial and parallel sections and showing the data flow paths indicated in dash-dot lines.

Referring now to FIG. 2, there is shown the serial-parallel-serial configuration of FIG. 1 with the logic blocks omitted and the respective data flow paths indicated symbolically by the dash-dot lines for clarity in illustration. It will be seen in FIG. 2 that the data bits transmitted from the output O2 of the second serial section S2 may be regenerated and transmitted to the input I1 of the first serial section S1. Similary, the data bits transmitted from the output O1 of the first serial section S1 may be regenerated and transmitted to the input I2 of the second serial section S2.

For simplicity and clarity in illustration, the disclosed embodiment of the invention is shown as having a parallel section P with only eight columns or channels of charge packet storage sites, each column being designated by a respective one of the references C1 through C8. As shown in the drawing, the data flow paths of the odd-numbered columns C1, C3, C5, C7 flow upwardly from the first serial section S1 to the second serial section S2 as indicated by the arrows. The alternate even-numbered columns C2, C4, C6, C8 have downwardly extending arrows applied thereto to indicate that the data bits in these columns flow downwardly from the serial section S2 to the serial section S1.

Figure 3:
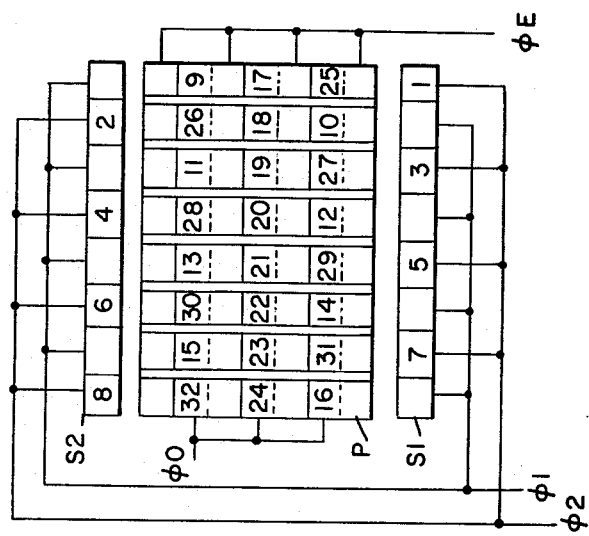

Referring now to FIGS. 3 to 14 inclusive, there is shown the step-by-step sequence of the bidirectional interlaced flow of data bits. Referring first to FIG. 3, it will be assumed that the alternate odd data bits 1, 3, 5, 7 of a serial bit stream have been shifted serially into the first serial section S1 and that the alternate even data bits 2, 4, 6, 8 of the stream have then been shifted serially into the second serial section S2. The bits previously shifted into the parallel section P are indicated by the numerals in FIG. 3 in the respective charge storage sites constituting the matrix of the parallel section.

Referring now to FIG. 15, this depicts the clocking associated with the bit sequences before and up to FIG. 3. At this point a skip interval is incurred because a series to parallel transfer is performed.

Figure 5:
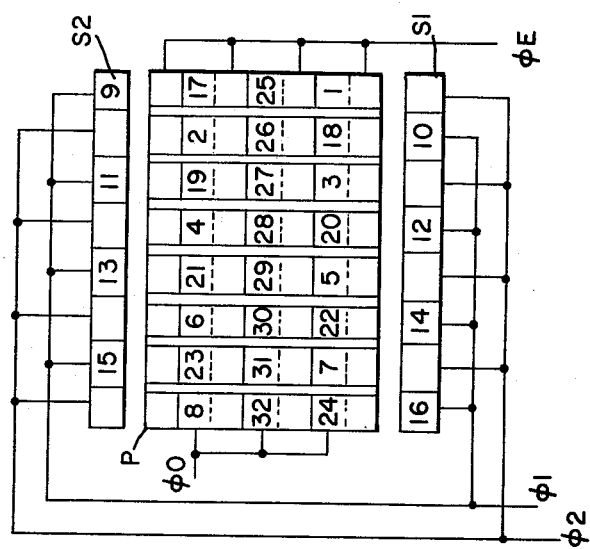
Figure 4:
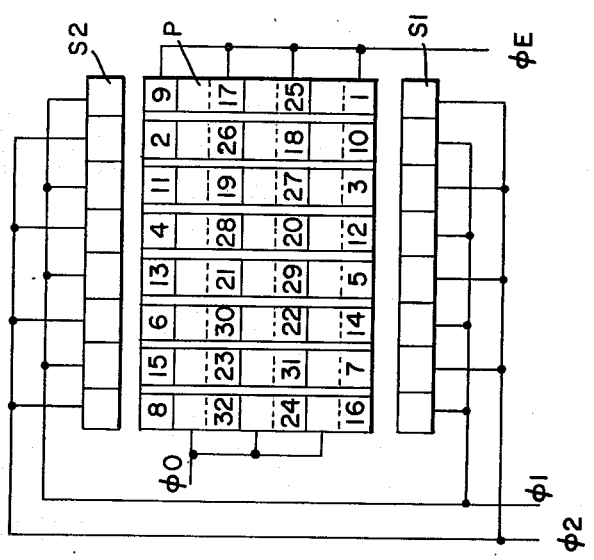
Figure 6:
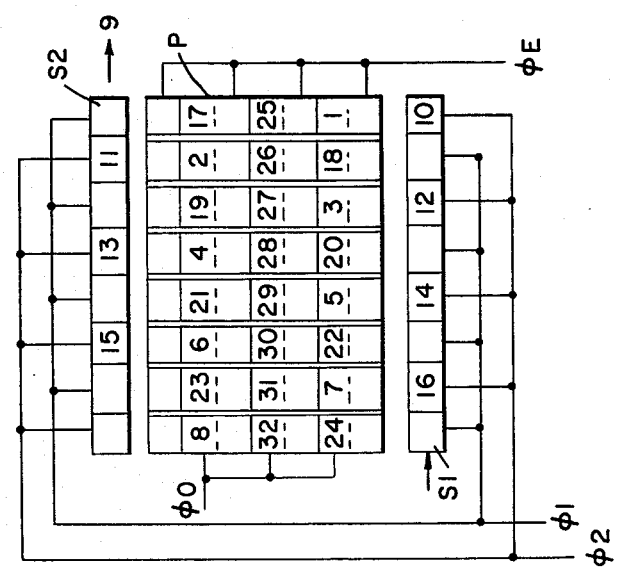
Figure 11:
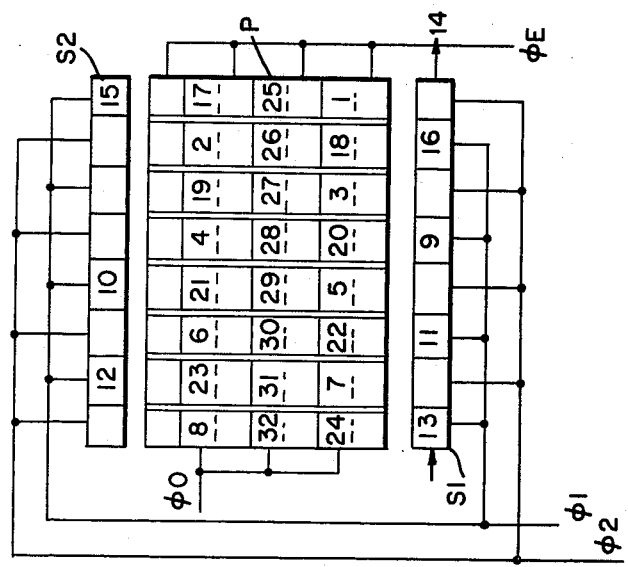
Figure 10:
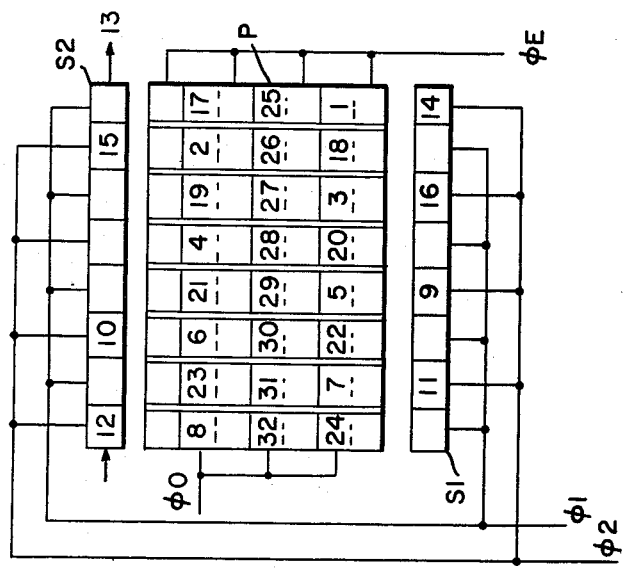
Figure 9:
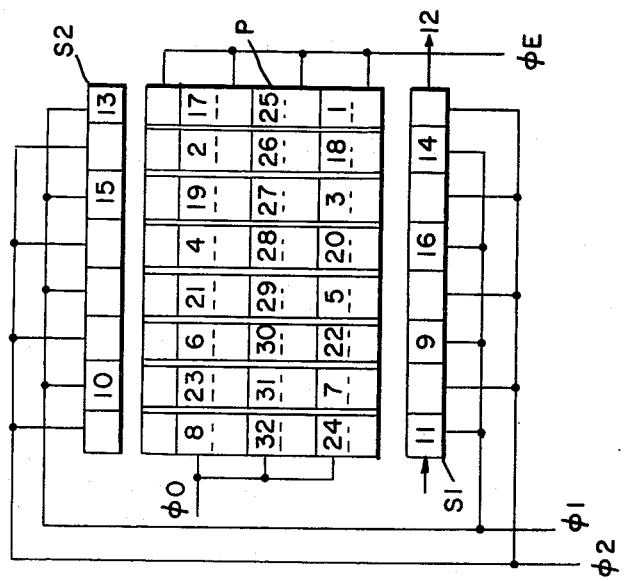
Figure 14:
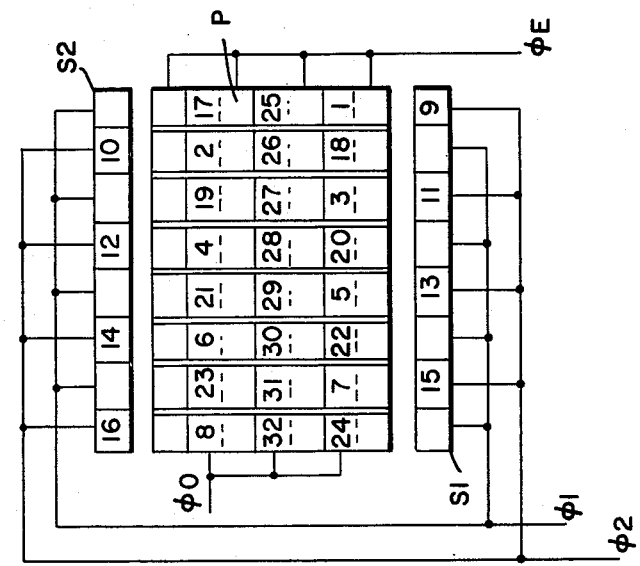
Figure 13:
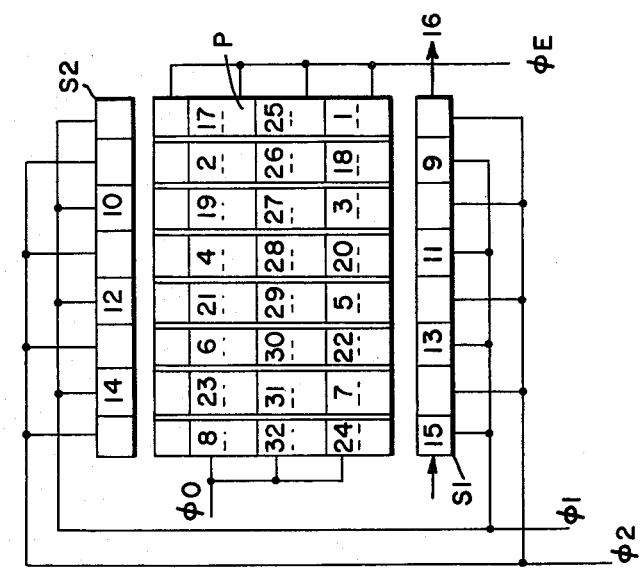
Figure 12:
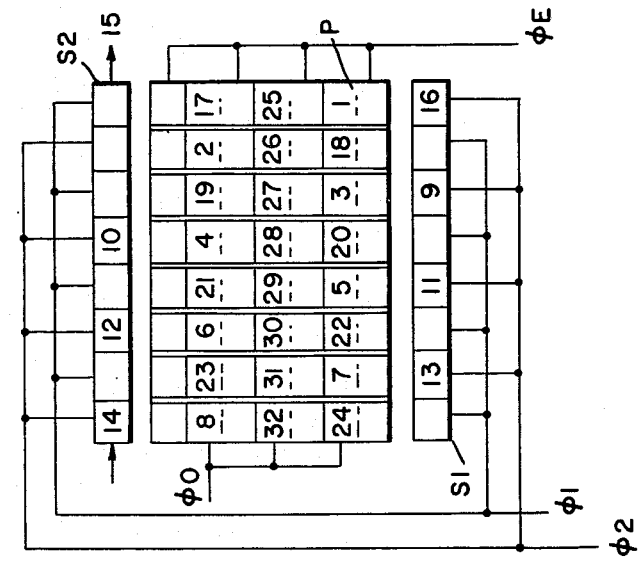

Data is not inputted or outputted from this structure during the skip interval. FIGS. 4, 5 and 6 are associated with skip interval during the transfer of data between the series and parallel sections, while FIGS. 7 through 14 are associated with external recirculation or data inputting and outputting.

As shown in FIG. 4, upon application of clock pulse $\phi E$, the odd data bits 1, 3, 5, 7 are transferred in parallel to the lowermost row of the matrix constituting parallel section P, and at the same time the even data bits 2, 4, 6, 8 in the second serial section 2 are transferred downwardly to the uppermost row of parallel section P. The bits within the matrix are also shifted to new storage sites as shown in FIG. 4. The even data bits 2, 4, 6, 8 are transferred to the even-numbered columns C2, C4, C6, C8 having downwardly-directed flow paths as indicated in FIGS. 1 and 2, whereas the odd data bits 1, 3, 5, 7 are transferred to the odd-numbered columns C1, C3, C5, C7 having upwardly-directed flow paths indicated by the arrows in said figures.

As shown in FIG. 5, application of the clock pulse $\phi 0$ then causes the data bits represented by charge storage packets within the parallel section P to be shifted vertically to the next adjacent charge storages site in the respective columns, with those data bits in columns C2, C4, C6, C8 moving downwardly and those data bits within columns C1, C3, C5, C7 moving upwardly. The application of clock pulse $\phi 1$ also causes bits 10, 12, 14, 16 to be transferred in parallel from the lowermost row of parallel section P into the first serial section S1. Simultaneously, the application of clock pulse $\phi 1$ causes bits 9, 11, 13, 15 to be transferred in parallel from the uppermost row of parallel section P into the second serial section S2.

Referring now to FIG. 6, alternate application of clock pulses φ1 and φ2 cause bits 9, 11, 13, 15 to be shifted serially through the second serial section S2 toward the output end of the latter. These bits may be transmitted to the output port designated OUTPUT in FIG. 1, or may be transmitted to the input end of the first serial section S1 as shown in FIG. 7 where bit 9 has been transferred to the first charge storage site of the first serial section S1.

Figure 8:
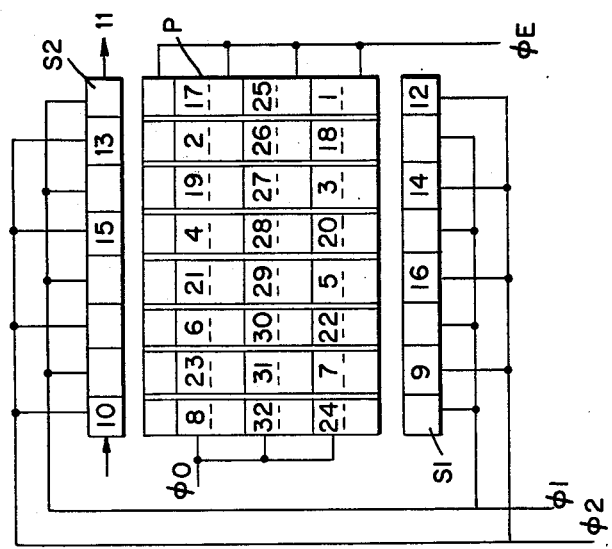
Figure 7:
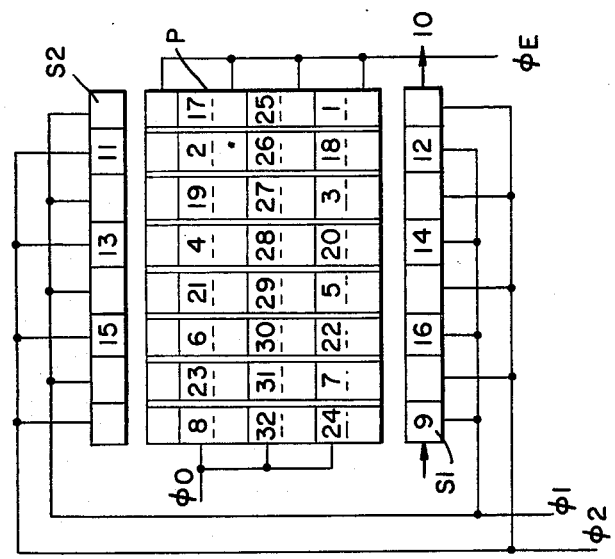

In a similar manner, bits 10, 12, 14, 16 are shifted serially through the first serial section S1, as shown in FIG. 7, and may be transmitted to the output port, or may be transmitted to the input end of the second serial section S2. The latter alternative is shown in FIG. 8 wherein bit 10 has been transferred to the first charge storage site of the second serial section S2.

Referring now to FIGS. 9 to 14, application of clock signals φ1 and φ2 is shown as serially shifting the bit sequence 9, 11, 13, 15 out of the second serial section S2 and into the first serial section S1, while the bit sequence 10, 12, 14, 16 is being serially shifted out of the first serial section S1 and into the second serial section S2. The progressive steps are shown sequentially in FIGS. 10, 11, 12 and 13, with the final result of this transfer being shown in FIG. 14.

The clock signal φE will then transfer bits 10, 12, 14, 16 into alternate charge storage sites of the uppermost row of parallel section P, while simultaneously bits 9, 11, 13, 15 are transferred into alternate charge storage sites in the lowermost row of parallel section P, in a manner similar to that shown by the transition occurring from FIG. 3 to FIG. 4 and described above. It will be seen that continued strobing of the clock signals φ1, φ2, φE will eventually transfer all of the data bits to their original positions shown in FIG. 3, assuming that the device is maintained in the regenerative mode.

While the invention has been shown and particularly described with reference to a preferred embodiment, it will be understood by those skilled in the art that various changes in form and detail may be made therein without departing from the scope of the invention which is delineated in the appended claims.

REFERENCES CITED BY APPLICANT

1. Boyle, W. S. and Smith, G. E., "Charge Coupled Semiconductor Devices," Bell Sys. Tech. J. (April 1970) pp. 587–593.
2. Boyle, W. S. and Smith, G. E., U.S. Pat. No. 3,858,232; issued Dec. 31, 1974; filed Nov. 9, 1971.
3. Smith, G. E., U.S. Pat. No. 3,761,744; issued Sept. 25, 1973; filed Dec. 2, 1971.
4. Weimer, P. K., U.S. Pat. No. 3,763,480; issued Oct. 2, 1973; filed Oct. 12, 1971.
5. Tompsett, M. F., "Charge Transfer Devices," J. Vac. Sci. Technol., Vol. 9, No. 4, (July-August 1972) pp. 1166–1181.
6. Collins, D. R., Barton, J. B., Buss, D. C., Kmetz, A. R., and Schroeder, J. E., "CCD Memory Options," 1973 IEEE International Solid-State Circuits Conference, (February 1973) pp. 136–137, 210.
7. Carnes, J. E. and Kosonocky, W. F., "Charge-Coupled Devices and Applications," Solid State Technology, (April 1974) pp. 67–77.
8. Kosonocky, W. F. and Sauer, D. J., U.S. Pat. No. 3,967,254; issued June 29, 1976; filed Nov. 18, 1974.
9. Elmer, B. R., Tchon, W. E., Denboer, A. J., Frommer, R., Kohyama, S. and Hirabayashi, K. "Fault Tolerant 92160 Bit Multiphase CCD Memory," IEEE International Solid-State Circuits Conference (February 1977) pp. 116–117.
10. Elmer, B. R., U.S. Pat. No. 4,024,509; issued May 17, 1977; filed June 30, 1975.
11. Elmer, B. R. and Tchon, W. E., U.S. Pat. No. 3,986,179; issued Oct. 12, 1976; filed June 30, 1975.
12. Erb, D. M., U.S. Pat. No. 3,913,077; issued Oct. 14, 1975; filed Apr. 17, 1974.

What is claimed is:

1. A bidirectional serial-parallel-serial charge-coupled device structure comprising a first serial section formed in a semiconductor material and including a predetermined number of charge storage sites arranged in a serial path and each site having associated therewith a respective gate electrode controlling the electrical potential of the site, a second serial section formed in said semiconductor material and including a number of charge storage sites equal to said predetermined number and arranged in a serial path and each site having associated therewith a respective gate electrode for controlling the electrical potential of the site, a parallel intermediate section formed in said semiconductor material and including a matrix of charge storage sites forming parallel charge transfer paths extending between said serial sections, each of said parallel paths extending from a respective storage site of one serial section to a respective storage site of the other serial section, input means for feeding to said device a serial stream of data bit signals comprising alternate odd and even bits, first means for transmitting to said first serial section a first stream of charge packets corresponding to said odd data bit signals, second means for transmitting to said second serial section a second stream of charge packets corresponding to said even data bit signals, control clocking means for applying voltages to the electrodes of the serial sections to transfer said charge packets serially from site to site until the first serial section contains a row of said odd data bit charge packets and said second serial section contains a row of said even data bit charge packets, said control clocking means including means to transfer said row of odd data bit charge packets from said first serial section to said parallel section and to transfer said row of even data bit charge packets from said second serial section to said parallel section, said control clocking means further including means for applying voltages to the electrodes of the parallel intermediate section to transfer said row of odd data bit charge packets in one direction from said first serial section to said second serial section simultaneously therewith to transfer said row of even data bit charge packets in the opposite direction from said second serial section to said first serial section, first output means for transmitting a first output serial stream of bit signals corresponding to the even data bit charge packets in said first serial section, and second output means for transmitting a second output serial stream of bit signals corresponding to the odd data bit charge packets in said second serial section.

2. In an interlaced SPS CCD memory, the improvement comprising:

first and second serial registers;

a parallel section;

means for alternately transferring a serial data bit stream into said first and second serial registers;

means for transferring data bits in parallel from each said first and second registers into said parallel section;

means for propagating alternate rows of data bits within said parallel section in opposite directions until data is transferred in parallel from said parallel section into each said first and second serial registers; and means for alternately reading out data bits from said first and second serial registers.

3. A bidirectional serial-parallel-serial charge-coupled device structure comprising a first serial section formed in a semiconductor material and including a predetermined number of charge storage sites, a second serial section formed in said semiconductor material and including a number of charge storage sites equal to said predetermined number, a parallel intermediate section formed in said semiconductor material and including a matrix of charge storage sites forming parallel charge transfer paths extending between said serial sections, input means for feeding to said device a serial stream of data bit signals comprising alternate odd and even bits, first means for transmitting to said first serial section a first stream of charge packets corresponding to said odd data bit signals, second means for transmitting to said second serial section a second stream of charge packets corresponding to said even data bit signals, control means to transfer said charge packets serially from site to site of said serial sections, said control means including means to transfer successive rows of odd data bit charge packets in one direction through said parallel section from said first serial section to said second serial section and to simultaneously transfer even data bit charge packets in the opposite direction through said parallel section from said second serial section to said first serial section, first output means for transmitting a first output serial stream of bit signals corresponding to the even data bit charge packets in said first serial section, and second output means for transmitting a second output serial stream of bit signals corresponding to the odd data bit charge packets in said second serial section.

4. An interlaced SPS CCD memory comprising first and second serial sections, an intermediate parallel section extending between said sections, means for alternately transferring the odd and even bits of a serial data bit stream into said first and second serial sections respectively, means for transferring said data bits in parallel from each of said first and second sections into said parallel section;

means for propagating alternate rows of data bits within said parallel section simultaneously in opposite directions until the odd data bits are transferred into said second section and the even data bits are transferred into said first section, and means for alternately reading out the odd and even transferred data bits from said second and first serial sections respectively.

5. A bidirectional serial-parallel-serial charge-coupled device structure comprising a first serial section formed in a semiconductor material and including a predetermined number of charge storage sites arranged in a serial path and each site having associated therewith a respective gate electrode controlling the electrical potential of the site, a second serial section formed in said semiconductor material and including a number of charge storage sites equal to said predetermined number and arranged in a serial path and each site having associated therewith a respective gate electrode for controlling the electrical potential of the site, a parallel intermediate section formed in said semiconductor material and including a matrix of charge storage sites forming parallel charge transfer paths extending between said serial sections, each of said parallel paths extending from a respective storage site of one serial section to a respective storage site of the other serial section, a first set of said paths constituting channels for transferring charge packets in one direction, a second set of said paths constituting channels for transferring charge packets in the opposite direction, said sets of paths being mutually interleaved with each channel of one set extending between two adjacent channels of the other set, input means for feeding to said device a serial stream of data bit signals comprising alternate odd and even bits, first means for transmitting to said first serial section a first stream of charge packets corresponding to said odd data bit signals, second means for transmitting to said second serial section a second stream of charge packets corresponding to said even data bit signals, control clocking means for applying voltages to the electrodes of the serial sections to transfer said charge packets serially from site to site until the first serial section contains a said odd data bit row of charge packets and said second serial section contains a row of said even data bit charge packets, and said control clocking means including means for applying voltages to the electrodes of the parallel intermediate section to transfer successive rows of odd data bit charge packets in one direction from said first serial section to said second serial section and simultaneously transfer even data bit charge packets in the opposite direction from said second serial section to said first serial section.

6. An interlaced SPS CCD memory comprising:

first and second serial registers;

a parallel section;

means for alternately transferring odd and even bits of a serial data bit stream into said first and second serial registers respectively;

means for transferring data in parallel from each said first and second registers into said parallel section;

means for propagating alternate rows of data bits within said parallel section in interleaved oppositely-directed channels until said data bits are transferred in parallel from said parallel section into each said first and second serial registers; and means for alternately reading out even and odd data bits from said first and second serial registers respectively.

7. A bidirectional serial-parallel-serial charge-coupled device structure comprising
a first serial section including a predetermined number of charge storage sites,
a second serial section including a number of charge storage sites equal to said predetermined number,
a parallel intermediate section including matrix of charge storage sites forming parallel charge transfer paths extending between said serial sections,
a first set of said paths constituting channel for transferring odd data bit charge packets in one direction,
a second set of said paths constituting channels for transferring even data bit charge packets in the opposite direction,
said sets of paths being mutually interleaved with each channel of one set extending between two adjacent channels of the other set,
input means for feeding to said device a serial stream of data bit signals comprising alternate odd and even bits,
first input means for transmitting to said first serial section a first stream of charge packets corresponding to said odd data bit signals,
second input means for transmitting to said second serial section a second stream of charge packets corresponding to said even data bit signals,
control clocking means to transfer said charge packets serially from site to site until the first serial section contains a plurality of said odd data bit charge packets and said second serial section contains a plurality of said even data bit charge packets,
said control clocking means including means to transfer successive rows of odd data bit charge packets in said one direction from said first serial section to said second serial section and to simultaneously transfer even data bit charge packets in said opposite direction from said second serial section to said first serial section,
first output means for transmitting a first output serial stream of bit signals corresponding to the even data bit charge packets in said first serial section, and
second output means for transmitting a second output serial stream of bit signals corresponding to the odd data bit charge packets in said second serial section.

8. A bidirectional serial-parallel-serial charge-coupled device structure comprising
a first serial section including a predetermined number of charge storage sites arranged in a serial path,
a second serial section and including a number of charge storage sites equal to said predetermined number and arranged in a serial path,
a parallel intermediate section and including a matrix of charge storage sites forming parallel charge transfer paths extending between said serial sections,
a first set of said paths constituting channels for transferring charge packets in one direction,
a second set of said paths constituting channels for transferring charge packets in the opposite direction,
said sets of paths being mutually interleaved with each channel of one set extending between two adjacent channels of the other set,
input means for feeding to said device a serial stream of data bit signals comprising alternate odd and even bits,
first means for transmitting to said first serial section a first stream of charge packets corresponding to said odd data bit signals,
second means for transmitting to said second serial section a second stream of charge packets corresponding to said even data bit signals, and
control clocking means for transferring successive rows of odd data bit charge packets in one direction along said first set of paths from said first serial section to said second serial section and for simultaneously transferring even data bit charge packets in the opposite direction along said second set of paths from said second serial section to said first serial section.

9. An interlaced SPS CCD memory comprising:
first and second serial registers;
a parallel section;
means for alternately transferring odd and even bits of a serial data bit stream into said first and second serial registers respectively;
means for transferring data bits in parallel from each said first and second registers into said parallel section;
means for propagating alternate rows of data bits within said parallel section in interleaved oppositely-directed channels until said data bits are transferred in parallel through said parallel section into each said first and second serial registers; and
means for alternately reading out even and odd data bits from said first and second serial registers respectively.

10. A bidirectional serial-parallel-serial charge-coupled device structure comprising
a first serial section including a predetermined number of charge storage sites,
a second serial section including a number of charge storage sites equal to said predetermined number,
a parallel intermediate section including a matrix of charge storage sites forming parallel charge transfer paths extending between said serial sections,
input means for feeding to said device a serial stream of data bit signals comprising alternate odd and even bits,
a first set of said paths constituting channels for transferring odd data bits in one direction,
a second set of said paths constituting channels for transferring even data bits in the opposite direction,
said sets of paths being mutually interleaved with each channel of one set extending between two adjacent channels of the other set,
first means for transmitting to said first serial section a first stream of odd data bits,
second means for transmitting to said second serial section a second stream of even data bits,
control clocking means to transfer successive rows of odd data bits along said first set of paths in said one direction from said first serial section to said second serial section and to simultaneously transfer even data bits along said second set of paths in said opposite direction from said second serial section to said first serial section,
first output means for transmitting a first output serial stream of even data bits from said first serial section, and
second output means for transmitting a second output serial stream of the odd data bits from said second serial section.

* * * * *